United States Patent
Ayranci et al.

(10) Patent No.: US 10,177,715 B1
(45) Date of Patent: Jan. 8, 2019

(54) FRONT END MODULE WITH INPUT MATCH CONFIGURABILITY

(71) Applicant: pSemi Corporation, San Diego, CA (US)

(72) Inventors: Emre Ayranci, Costa Mesa, CA (US); Miles Sanner, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/728,314

(22) Filed: Oct. 9, 2017

(51) Int. Cl.
*H03F 1/07* (2006.01)
*H03F 1/26* (2006.01)
*H03F 3/19* (2006.01)
*H03F 1/56* (2006.01)
*H04B 1/16* (2006.01)
*H04B 1/40* (2015.01)

(52) U.S. Cl.
CPC .............. *H03F 1/26* (2013.01); *H03F 1/565* (2013.01); *H03F 3/19* (2013.01); *H03F 2200/165* (2013.01); *H03F 2200/222* (2013.01); *H03F 2200/294* (2013.01); *H03F 2200/372* (2013.01); *H03F 2200/451* (2013.01); *H04B 1/16* (2013.01); *H04B 1/40* (2013.01)

(58) Field of Classification Search
CPC ................................. H03F 1/07; H03F 1/0288
USPC ............................................... 330/295, 124 R
See application file for complete search history.

(56) References Cited

U.S. PATENT DOCUMENTS

| | | | |
|---|---|---|---|
| 9,024,700 B2 | 5/2015 | Ranta | |
| 9,929,701 B1 | 3/2018 | Noori et al. | |
| 9,941,849 B1 | 4/2018 | Ayranci et al. | |
| 2006/0040628 A1* | 2/2006 | Porret | H03J 5/244 455/234.1 |
| 2013/0020305 A1* | 1/2013 | Lamesch | B60N 2/002 219/217 |
| 2013/0043944 A1* | 2/2013 | Jones | H03F 1/0227 330/124 R |

(Continued)

OTHER PUBLICATIONS

Ayranci, et al., "Optimized Multi Gain LNA Enabling Low Current and High Linearity including Highly Linear Active Bypass", application filed in the USPTO on Apr. 4, 2017, U.S. Appl. No. 15/479,173, 25 pgs.

*Primary Examiner* — Henry Choe

(74) *Attorney, Agent, or Firm* — Jaquez Land Greenhaus LLP; Martin J. Jaquez, Esq.; Bruce W. Greenhaus, Esq.

(57) ABSTRACT

A front end module (FEM) and associated method for receiving signals in a front end module are disclosed. Some embodiments of the FEM have three inputs. The FEM can process the input signals in one of three bypass modes. In bypass modes, switchable tank circuits provide a high impedance to isolate active components from the bypass path. This improves the input return loss in the passive bypass mode and thus improves the performance of the passive bypass mode by allowing the use of LNAs without an input switch. In the active gain mode, one of a plurality of signals are amplified by one of an equal number of amplifiers coupled to the FEM output. Accordingly, the FEM can output signals applied to any one of the FEM inputs in bypass mode, or an amplified version of one of the input signals. In some embodiments, the FEM has only one input and one LNA. In such embodiments, an output selector switch selects between a bypass path and a gain path.

12 Claims, 11 Drawing Sheets

(56) References Cited

U.S. PATENT DOCUMENTS

2014/0111017 A1* 4/2014 Kim ........................ H01F 38/14
307/104

* cited by examiner

FRONT END MODULE WITH INPUT MATCH CONFIGURABILITY

BACKGROUND

(1) Technical Field

This disclosure relates to transceivers, and more specifically to methods and apparatus for selecting between bypass modes and active gain modes in a receiver.

(2) Background

The front-end of a communications receiver typically includes an amplifier, such as a low-noise amplifier ("LNA"). The LNA is responsible for providing the first-stage amplification to a signal received by the communications receiver. The operational specifications of the LNA are very important to the overall quality of the communications receiver. Any noise or distortion introduced by the LNA will cause a degradation in the overall receiver performance. That is, the sensitivity of a receiver is in large part determined by the quality of the front-end, and in particular, by the quality of the LNA. The sensitivity of the receiver, in turn, determines the amount of information that can be transmitted in a predetermined amount of time (e.g., the bit rate in bits per second) at a predetermined bit error rate.

The quality of an LNA often times depends upon parameters such as noise figure (NF), input impedance match, output impedance match, gain and linearity. These characteristics determine the amount of distortion imposed on signals received through the front-end, how strong a signal needs to be and the signal-to-interference-plus-noise ratio (SINR) required to recover information transmitted at a particular data rate. Demand continues to grow for ever higher data rates. High data rates require greater accuracy in the demodulation of signals received by today's receivers, making characteristics like NF, input impedance match and output impedance match important parameters to be controlled.

Some receivers are capable of receiving signals from one of several sources. There are significant challenges to designing a high performance LNA for use in a radio frequency (RF) front end module (FEM) that can select between several sources. In some cases, the challenge is made greater by the need to operate in several bands spread over a wide frequency range. In some such instances, a radio frequency (RF) front end module (FEM) is provided which has several input ports. Each port is dedicated to receiving signals within one frequency band from one of several sources. In some such cases, it is common for the receiver FEM to have a selector switch for selecting which input is to be coupled to the LNA. In addition, there may be several gain paths that the input can take. The selector switch can be controlled either directly by a user or by software to select both the gain path and the particular frequency band.

FIG. 1 is a simplified illustration of an FEM 100. The FEM 100 includes an LNA integrated circuit (LNAIC) 101 having several inputs 102, 104, 106. In some cases, a "solder ball" is used on the LNAIC 101 to provide a point of electrical contact between the LNAIC 101 (and in particular each input 102, 104, 106) and one or more signal sources external to the LNAIC 101. In the particular case shown in FIG. 1, each input 102, 104, 106 receives signals from a corresponding one of several surface acoustic wave (SAW) filters 108, 110, 112 within the FEM 100. Each SAW filter 108, 110, 112 is tuned to the frequency band of the corresponding input 102, 104, 106. A double pole, three throw input selector switch 114 provides a means by which the inputs can be connected to one of two signal paths 115, 117.

The first signal path 115 is a high gain path that couples one of the SAW filters 108, 110, 112 to an input inductor 116 that resides outside the LNAIC 101. The input inductor 116 is coupled to the LNAIC 101 through two contacts 118, 120. The signal routed through the input inductor 116 and coupled back to the LNAIC 101 by the second contact 120. The signal is coupled from the second contact 120 to the input of an LNA 122 within the LNAIC 101. The output of the LNA 122 is coupled to a switched attenuator 124. The attenuator 124 provides additional control of the gain of the FEM 100. The output of the attenuator 124 is coupled to a high gain path input 125 of a single pole, double throw output selector switch 126. The output of the switch 126 is coupled to the output of the FEM 100. By selecting the high gain path input 125, the signal that traverses the high gain path 115 is coupled to the output of the FEM 100.

The second signal path 117 is a low gain path. The low gain path 117 couples the second output of the input selector switch 114 to a second switched attenuator 128. The attenuator 128 reduces the signal level before coupling the signal to a single pole, double throw bypass switch 130. The switch 130 selects between a bypass path 132 directly to the output selector switch 126 and a low gain path 134 to the input inductor 116 and LNA input. Selecting the low gain path 117 through the input selector switch 114 and the bypass output through the bypass switch 130 provides a passive bypass path having a gain <1. Alternatively, an active low gain path 134 can be selected through the FEM 100 that uses the attenuator 128 to attenuate the signal prior to amplification by the LNA 122 and uses attenuator 124 to attenuate the signal after amplification by the LNA 122.

The FEM 100 of FIG. 1 has at least two limitations. The first limitation is that the input selector switch 114 adds attenuation to the high gain path 115 prior to amplification by the LNA 122, reducing the noise figure of the high gain path. That is, when a signal is attenuated before amplification, the signal to noise level goes down and the NF goes up.

The second limitation is that the LNA 122 must simultaneously be optimized for operation in each frequency band. Since the range of frequencies for which the FEM 100 must operate can be relatively broad, it may be difficult to ensure optimum operation across the full spectrum of operating frequencies.

Accordingly, there is currently a need for a method and apparatus that allows an FEM to receive multiple inputs, select between the multiple inputs (including combinations of inputs) and select between active gain or passive bypass modes. Furthermore, it would be desirable to have an FEM with a low impedance path between inputs and the LNA in at least the high gain modes to help maintain best noise figure. The present disclosure presents a method and apparatus that meets this need.

SUMMARY

A front end module (FEM) and associated method for receiving signals in a FEM are disclosed. Some embodiments of the FEM have an LNAIC. The LNAIC has connection points through which signals can be coupled between the LNAIC and the other components of the FEM. The FEM can process the input signals in one of a plurality of bypass modes or in one of a plurality of active gain modes.

In one of the bypass modes, a signal applied to the FEM through one of several inputs is coupled directly to an FEM output through an output selector switch. The input to each LNA is isolated from the FEM output by a corresponding switchable tank circuit. The corresponding tank circuit comprises an inductor associated with a corresponding capacitor switch and a corresponding capacitance. The capacitor switch and the capacitor are coupled in series. The series combination of capacitance and capacitor switch is coupled in parallel to the corresponding inductor. In bypass mode, all of the LNAs are turned off and the capacitor switch within each tank circuit corresponding to the LNAs is closed. Closing the capacitor switch creates a resonant circuit between the inductor and a corresponding capacitance. Each tank circuit provides a relatively high impedance between the corresponding FEM input and the corresponding input of the LNA at the frequency of the input signal to be output by the FEM.

In some embodiments, in a first active gain mode, one of the LNAs is turned on and the associated capacitor switch is opened. The capacitor switches associated with the other LNAs are closed to form a high impedance tank circuit at the input of the LNAs that are turned off. The inductor that is in parallel with the open capacitor switch (i.e., the inductor associated with the LNA that is turned on) provides an input inductance to the operational LNA. The outputs of each LNA are coupled together. The outputs of the LNAs (only one of which is typically operational at a time) are coupled through an output capacitor to a switched attenuator. The output of the attenuator is coupled to the FEM output selector switch. Accordingly, the FEM can output signals applied to any one of several inputs that bypasses the LNAs in a bypass mode, or an amplified input signal in one of the several selectable active gain modes. In some embodiments, the FEM has only one input and one LNA. In such embodiments, the output selector switch selects between the bypass path and the gain path.

The details of one or more embodiments of the disclosed method and apparatus are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 1:
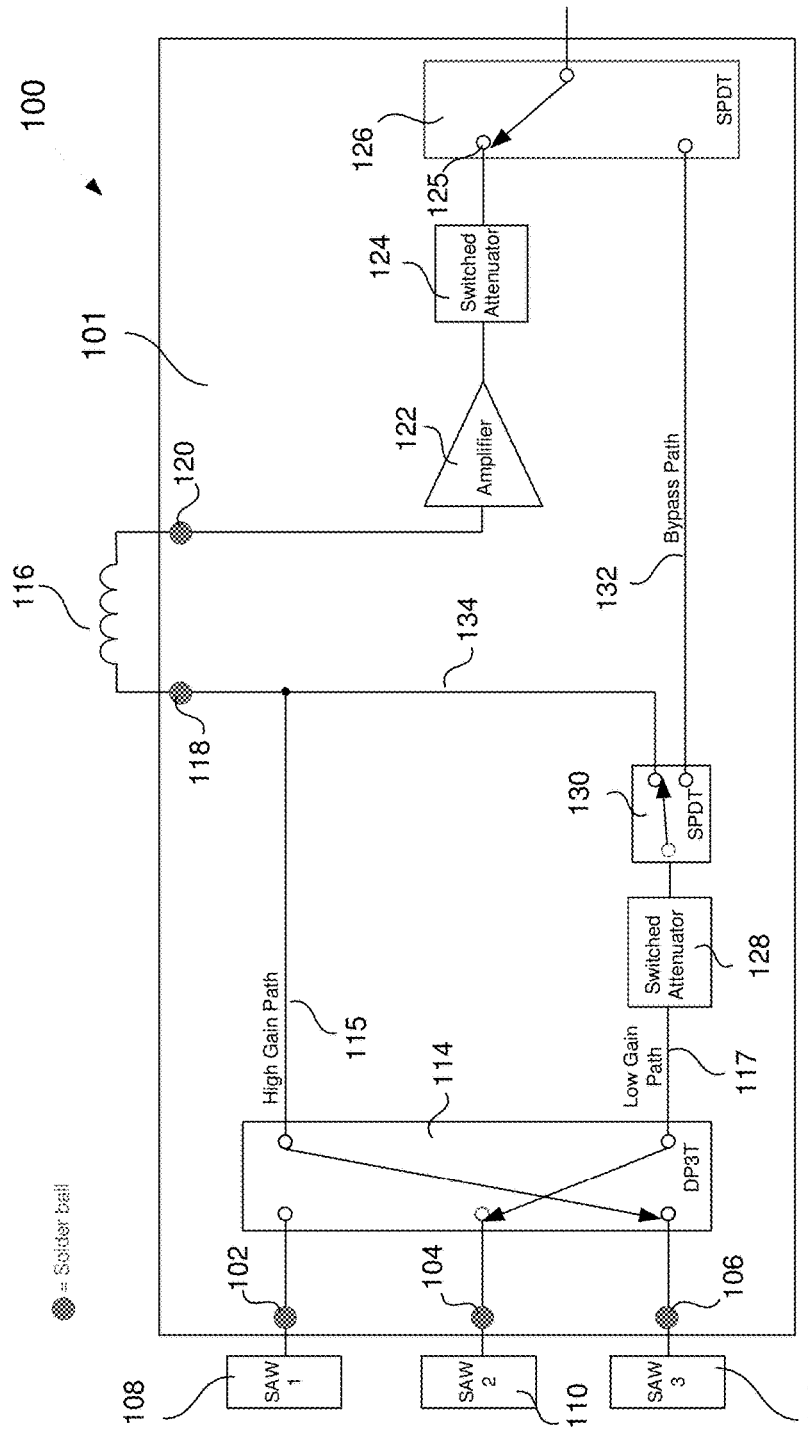
FIG. 1 is a simplified illustration of an FEM having several inputs.
Figure 2:
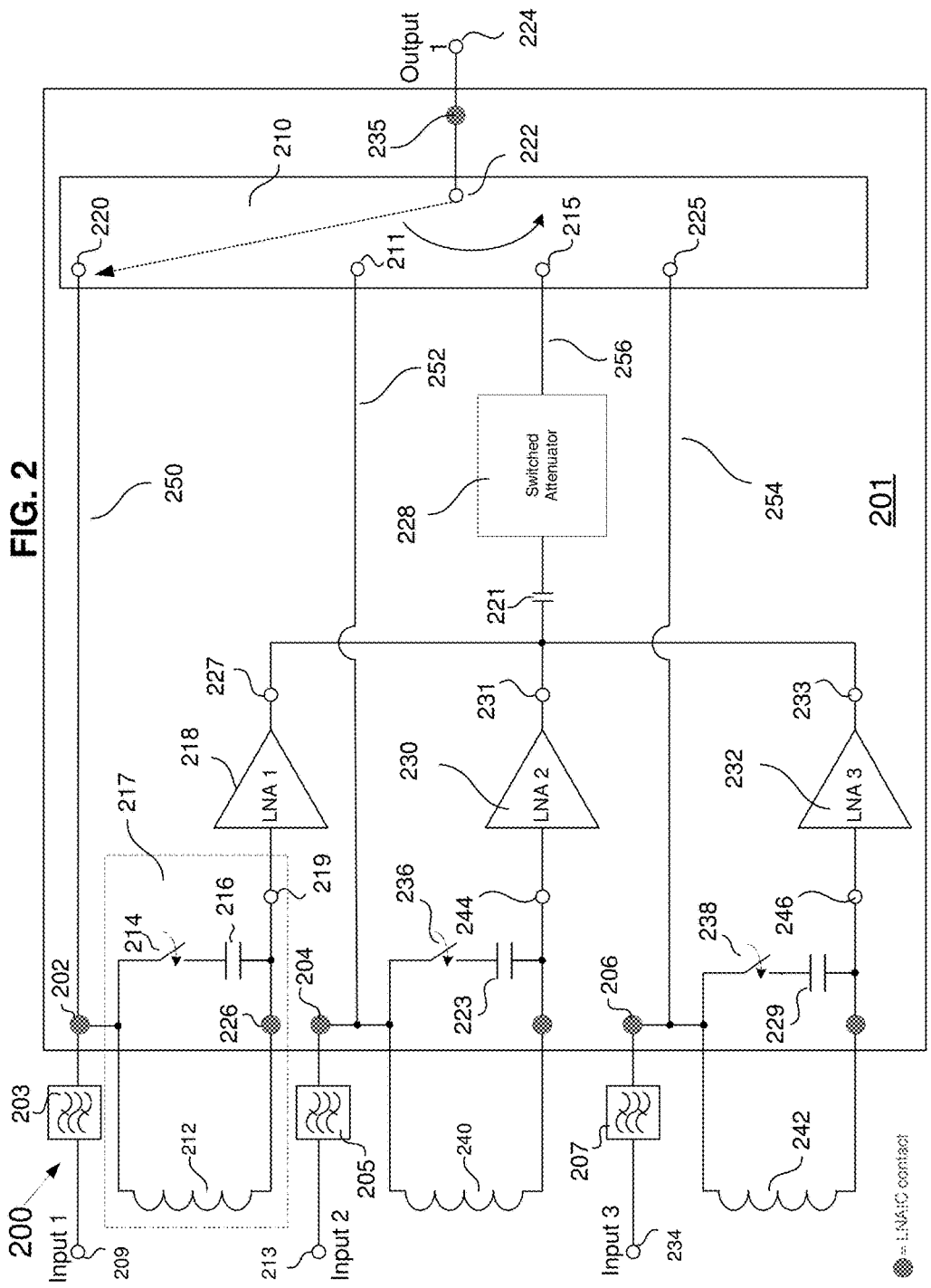
FIG. 2 is a simplified electrical schematic illustrating an FEM and associated external components in accordance with some embodiments of the disclosed method and apparatus.

FIG. 2 is a simplified electrical schematic illustrating an FEM 200 comprising a low noise amplifier integrated circuit (LNAIC) 201 and associated external components in accordance with some embodiments of the disclosed method and apparatus. In the embodiment shown in FIG. 2, the LNAIC 201 has three input connection points 202, 204, 206. In some embodiments, these are external connection points 202, 204, 206 implemented as solder balls, wirebonds, etc. on the LNAIC 201 that provide points of contact through which input signals can be coupled to the LNAIC 201 from external devices (such as filters 203, 205, 207, which in some embodiments may be SAW filters either within the FEM 200 or external to the FEM 200). In other embodiments in which the LNAIC 201 is integrated into a larger component of a receiver or other device, the connection points 202, 204, 206 are merely points that connect to other components within the receiver or other device.

The FEM 200 can process the input signals in one of several bypass modes or active modes. In the example shown in FIG. 2, the FEM 200 has three inputs 209, 213, 234. The LNAIC 201 has three input connection points 202, 204, 206 and associated LNAs 218, 230, 232. Accordingly, there are up to three possible active gain modes and three possible bypass modes. However, in other embodiments, any number of inputs and associated LNAs can be provided. Each such input and associated LNA can be associated with a corresponding bypass mode. In the example shown in FIG. 2, the first bypass mode, signals applied to the LNAIC 201 through the first input connection point 202 (i.e., input 1) are coupled directly to a contact 224 at the FEM output through an output selector switch 210. In some such embodiments, the output selector switch 210 selects between one of three bypass paths 250, 252, 254 and the gain path 256. In order to remove the load of the LNA 218, 230, 232 from the input connection point 202, 204, 206, a tank circuit is created by closing a capacitor switch 214, 236, 238 to place a capacitance 216, 223, 229 in parallel with an associated inductance 212, 240, 242. In some embodiments, the associated inductances 212, 240, 242 are within the FEM 200, but outside the LNAIC 201. In some embodiments, the capacitance 216, 223, 229 is provided by a capacitor. In other embodiments, the capacitance is provided by any other structure that has operational capacitance (i.e., that establishes a resonant tank circuit to establish a relatively high impedance at the operation frequency when placed in parallel with the associated inductance 212, 240, 242). In some embodiments, the capacitor switches 214, 236, 238 and the capacitances 216, 223, 229 are within the LNAIC 201. The tank circuit provides a relatively high impedance between a corresponding input connection point 202, 204, 206 and an associated LNA 218, 230, 232 when an associated capacitor switch 214, 236, 238 is closed. In each of the bypass modes, all of the capacitor switches 214, 236, 238 are closed to isolate the LNA inputs from the FEM inputs. In each of the gain modes, all but one of the capacitor switches 214, 236, 238 are closed. Opening one of the capacitor switches 214, 236, 238 allows the associated inductor 212, 240, 242 to be used as an input inductance to the associated LNA 218, 230, 232. In some embodiments, more than one LNA 218, 230, 232 may be active. In such cases, each capacitor switch 214, 236, 238 associated with an active LNA 218, 230, 232 would be open. Having more than one LNA 218, 230, 232 active at a time would require the architecture to be designed to sum the signals and handle the associated changes in the input and output impedances. For example, in some embodiments, additional impedance matching circuits (not shown) could be coupled to the input and/or output by switches that are activated when more than one LNA 218, 230, 232 is active.

In some embodiments, the outputs from each of the three LNAs 218, 230, 232 are coupled to a capacitor 221. The capacitor 221 is coupled to a variable attenuator (such as a switched attenuator 228). The output of the attenuator 228 is coupled to the contact 224 at the FEM output through the output selection switch 210 when the switch 210 is in the gain mode position. Accordingly, the FEM 200 can output signals applied to any one of the input connection points 202, 204, 206 in one of the bypass modes, or from one of the LNAs 218, 230, 232 in one of the gain modes.

In some embodiments, the LNAIC 201 has only one input connection point 202 and one LNA 218. In alternative embodiments, the FEM 200 can operate in a combined gain mode in which inputs from more than one LNA are combined prior to the FEM output 224.

A more detailed discussion of the signal path through the FEM 200 in bypass mode is provided first, followed by a more detailed discussion of the signal path through the FEM 200 in the gain mode. The signal paths for input signals applied to each of the three input connection points 202, 204, 206 are essentially the same. Therefore, for the sake of simplicity, only the signal path from the first input connection point 202 (i.e., the first input) to the output of the FEM 200 is discussed in detail.

Input signals enter the FEM 200 through an input 1 coupled to the input connection point 202 of the LNAIC 201. The contact 202 also provides a point of contact to components external to the LNAIC 201. In particular, in some embodiments, the input connection point 202 provides a connection point to a first terminal of the input inductor 212. A first terminal of the capacitor switch 214 that resides within the LNAIC 201 is also coupled to the input connection point 202. Alternatively, a separate inductance connection point (not shown) can be provided on the LNAIC 201. A second terminal of the switch 214 is coupled to a first terminal of the capacitor 216. A second terminal of the capacitor 216 is coupled to an inductance connection point 226. A second terminal of the inductor 212 is coupled to the LNAIC 201 through the inductance connection point 226. In some embodiments, the input inductor 212 resides outside the LNAIC 201 and is coupled to the LNAIC 201 through input connection points 202, and the inductance connection point 226. The capacitor 216 and the capacitor switch 214 reside within the LNAIC 201. In other embodiments, all of the components 212, 214, 216 reside within the LNAIC 201. In yet another embodiment, all of the components 212, 214, 216 reside outside the LNAIC 201.

In bypass mode, the switch 214 is closed. Closing the switch 214 places the capacitor 216 in parallel with the input inductor 212. Accordingly, the input inductor 212, capacitor switch 214 and capacitor 216 form a switchable tank circuit 217. The value of the capacitor 216 is selected such that for frequencies within the operational range of the first input, the impedance of the tank circuit 217 is relatively high with respect to the characteristic impedance of the system in which the FEM 200 resides. As is discussed further below, the value of the input inductor 212 is selected to provide a proper input impedance match for the LNA 218 in active gain mode.

For some embodiments in which the characteristic impedance of a receiver is 50 ohms, the impedance that is presented by the parallel tank circuit 217 may be above 1,000 ohms. In some embodiments, the tank circuit 217 can be tuned to resonate at the center frequency of the first input. In such cases, depending upon the Q of the tank circuit, the impedance presented by the tank circuit 217 can be much greater. It should be noted that the higher the Q of the tank circuit, the higher the impedance at resonance and the sharper the slope of the impedance curve near the resonant frequency. While high impedance is desirable to isolate the load at the output of the FEM 200 from the capacitive loading that would otherwise be imposed the LNA input, it may be advantageous to reduce the Q of the tank circuit 217 in order to provide a flatter frequency response in the operational frequency range. Alternatively, the frequency response of the tank circuit 217 over the operational range will be flatter if the tank circuit 217 is tuned to resonate at a frequency that is offset from the center of the operational frequency range. It will be clear to those skilled in the art that there is a tradeoff between having a relatively high impedance in the operational frequency range and attaining a desirable frequency response over the operational frequency range.

In some embodiments, the input connection point 202 is also coupled to a first input 220 of the output selector switch 210. In some embodiments, the output selector switch is a single pole, four throw output selector switch 210. Accordingly, the output 222 of the switch 210 can be selectively coupled to one of a plurality of inputs 220, 211, 215, 225 to the switch. In addition to closing the switch 214 in bypass mode, the first input 220 of the output selector switch 210 is selected (i.e., the first input 220 of the switch 210 is coupled to the output 222 of the switch 210). Accordingly, a path from the input connection point 202 to an LNAIC output connection point 235, and then on to a contact 224 at the output of the FEM 200 allows the LNA 218 to be bypassed, providing a passive bypass path for signals input through the FEM 200. The tank circuit 217 created when the switch 214 is closed provides a high impedance between the input connection point 202 and the LNA input 219 to reduce the effect of the LNA (e.g., loading by the input of the LNA 218) on the signals during passive bypass mode.

In a first of the active gain modes, the capacitor switch 214 is opened. In addition, the output selector switch 210 is set to select the fourth switch input 225. That is, the output of the attenuator 228 will be coupled through the switch 210 to the FEM output contact 224. With the capacitor switch 214 open, the signal applied to input 1 209 of the FEM 200 through the input connection point 202 of the LNAIC 201 is coupled through the input inductor 212 to the inductance connection point 226. The inductance connection point 226 is coupled to the LNA input 219. The inductance of the input inductor 212 is selected to provide a good input impedance match between the input signal source and the LNA 218. Therefore, with the capacitor switch 214 open, power will be efficiently coupled to the input of the LNA 218.

The output 227 of the LNA 218 is coupled through a capacitor 221 to the switched attenuator 228 within the LNAIC 201. In the embodiment shown in FIG. 2, in which there are three LNAs 218, 230, 232, the LNA output 227 is also coupled to the outputs 231, 233 of the other two LNAs 230, 232. However, in some embodiments of the disclosed method and apparatus, only one LNA 218, 230, 232 is active at a time in the active gain mode. The other LNAs are inactive (i.e., turned off) and the associated capacitor switch 214, 236, 238 is closed to create a high impedance to the input of the other LNAs 230, 232.

In some embodiments, the attenuation provided by the attenuator 228 is adjustable. Accordingly, the gain provided in the active gain mode can be controlled. In addition, in some embodiments, the gain of the amplifiers 218, 230, 232 can be controlled to further control the overall gain in the active gain mode. In the active gain mode, only one of the capacitor switches 214, 236, 238 are open to provide a signal path through the associated inductor 212, 240, 242 to the input 219, 244, 246 of the associated LNA 218, 230, 232. However, in an alternative embodiment, it is possible to have only signals associated with two or more of the inputs present in the output signal. In such cases, the capacitor switch 214, 236, 238 associated with those inputs that are not desired can be closed to increase the impedance presented to those inputs. In addition, further switching or gain control can be implemented within the LNAs 218, 230, 232.

Figure 3:
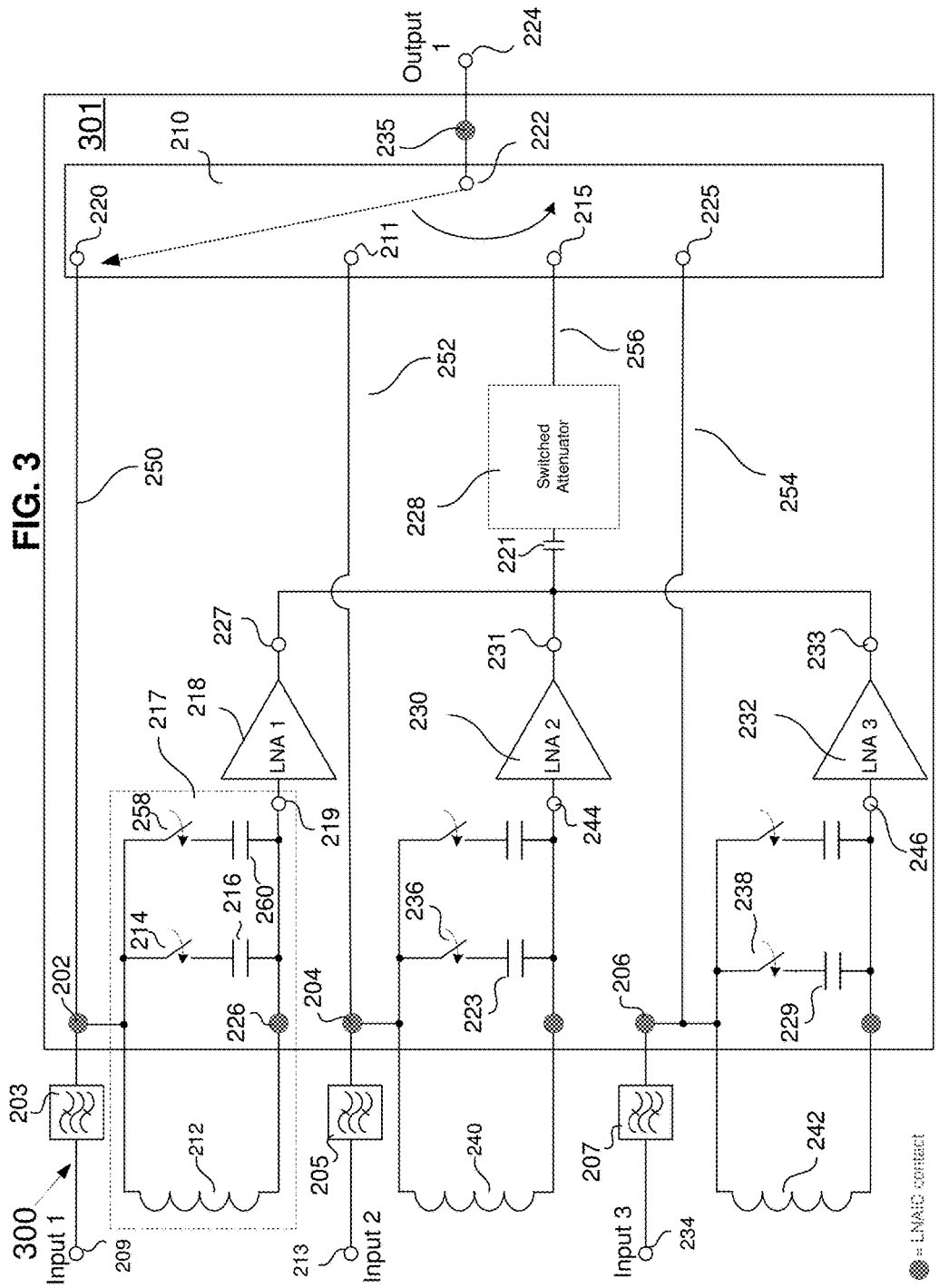
FIG. 3 is an illustration of an alternative embodiment, in which a second capacitor switch and capacitor are provided in parallel with the input inductor.

FIG. 3 is an illustration of an alternative embodiment of an FEM 300 and LNAIC 301, in which a second series combination of capacitor switch 258 associated with a corresponding capacitor 260 are provided in parallel with the input inductor 212. Accordingly, if a first frequency is likely to be provided through input 2 when the second LNA 230 is active, the resonant frequency of the tank circuit 217 corresponding to inactive LNA 218 can be set to have a high impedance at that frequency by closing the first capacitor switch 214. If a second different frequency is provided through input 3 when the third LNA 232 is active, the resonant frequency of the tank circuit 217 can be adjusted to optimize the operation for the second frequency by closing the second capacitor switch 258. Likewise, an additional series combination of capacitor switch and capacitor can be placed in parallel with each of the other inductors 240, 242. It should be understood that the number of series combinations of capacitor switch and corresponding capacitor placed in parallel with each inductor can be selected to achieve a desired flexibility for embodiments in which different frequencies are presented (i.e., in order to adjust the resonant frequency of the tank circuit at the input of each LNA to optimize the operation for the input frequency presented at the inputs).

Figure 4:
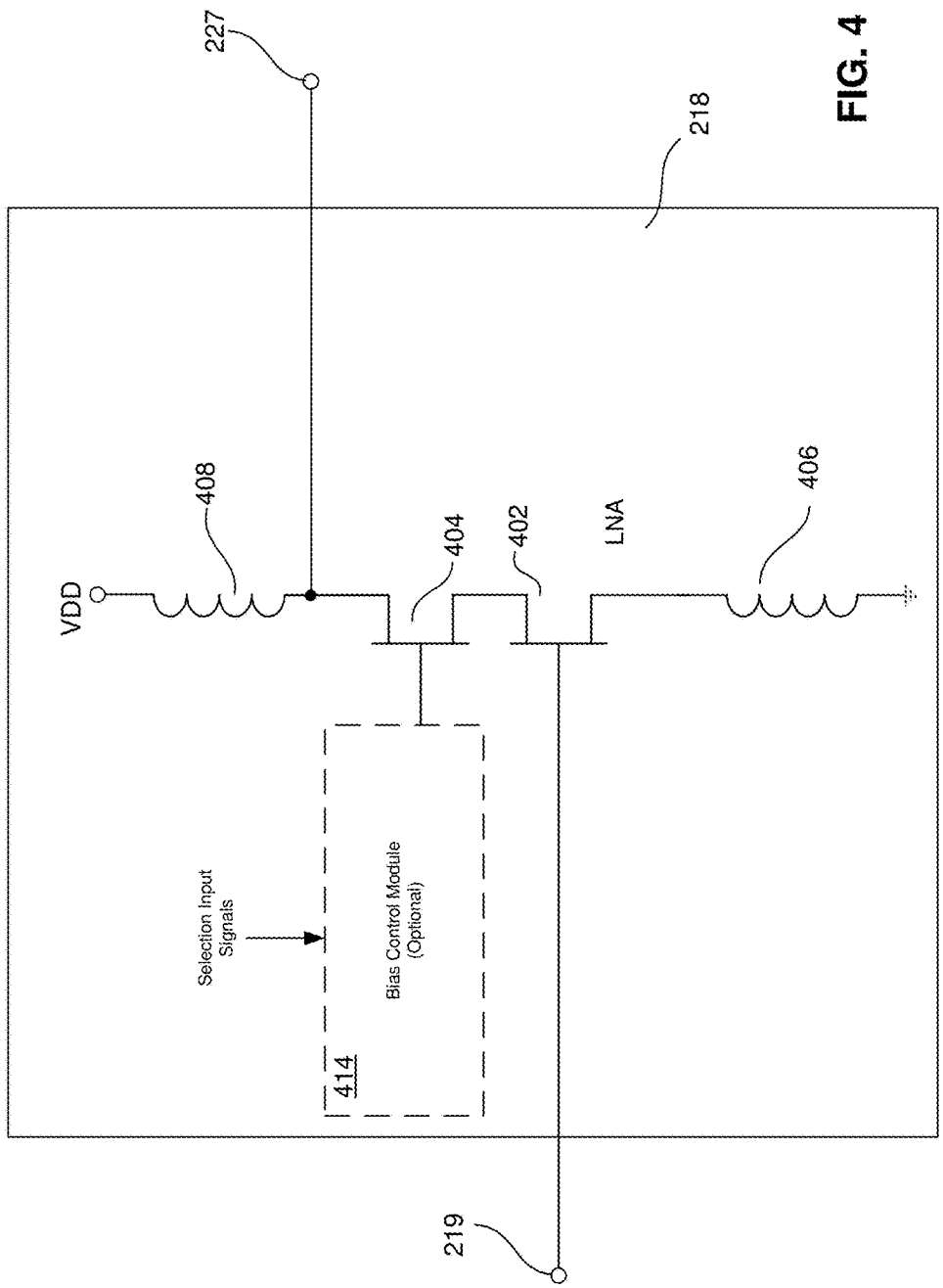
FIG. 4 is a simplified schematic of one embodiment of an LNA that may be used to implement the LNAs shown in FIG. 2 and FIG. 3.

FIG. 4 is a simplified schematic of one embodiment of an LNA 218 that may be used to implement the LNAs 218, 230, 232 shown in FIG. 2 and FIG. 3. The LNA 218 includes an input transistor 402 and an output transistor 404. In some embodiments, the input and output transistors 402, 404 are field effect transistors (FETs). The input 219 to the LNA is coupled to the gate of the input FET 402. The drain of the input FET 402 is coupled to the source of the output FET 404. The source of the input FET 402 is coupled to a first terminal of a degeneration inductor 406. A second terminal of the degeneration inductor 406 is coupled to ground. A load inductor 408 is coupled between the drain of the output FET 404 and a voltage source.

In some embodiments, a bias control module 414 controls a bias voltage that is coupled to the gate of the output FET 404. The bias voltage can be used to turn the LNA 218 on and off. In some cases, the LNA 218 is turned off when the input associated with the LNA 218 is in bypass mode (i.e., when the capacitor switch 214 is closed and the output selector switch 210 couples the input associated with the LNA 218 to the output of the FEM 200). In addition, in some embodiments, the LNA 218 may be turned off if the input associated with that LNA is not desired at the output of the FEM 200. Furthermore, in some embodiments, the bias voltage can also be used to control the gain of the LNA 218 when the FEM 200 is not in bypass mode (i.e., when the FEM 200 is in active gain mode).

Figure 5:
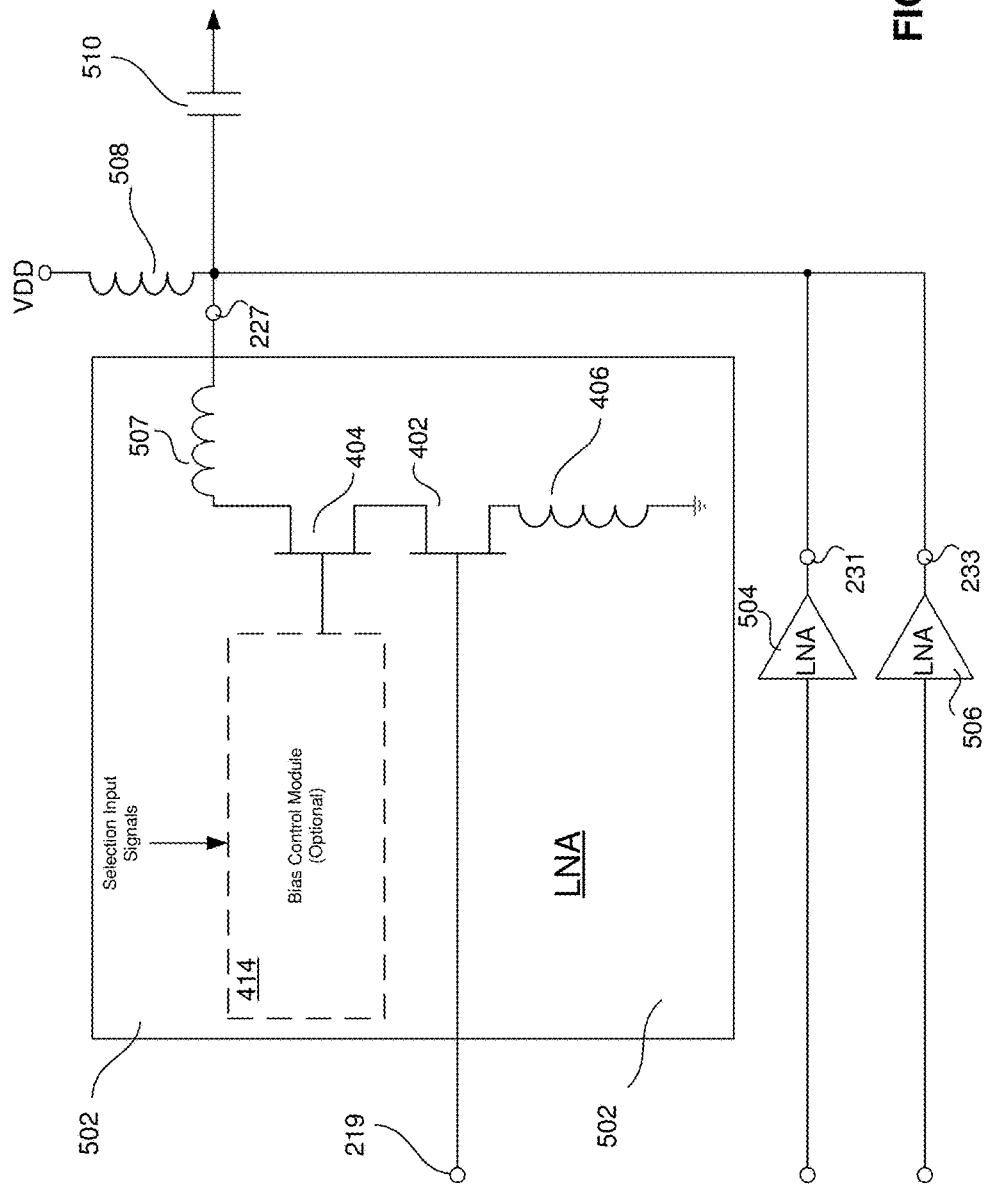
FIG. 5 is an illustration of three LNAs coupled together at their outputs.
Figure 6:
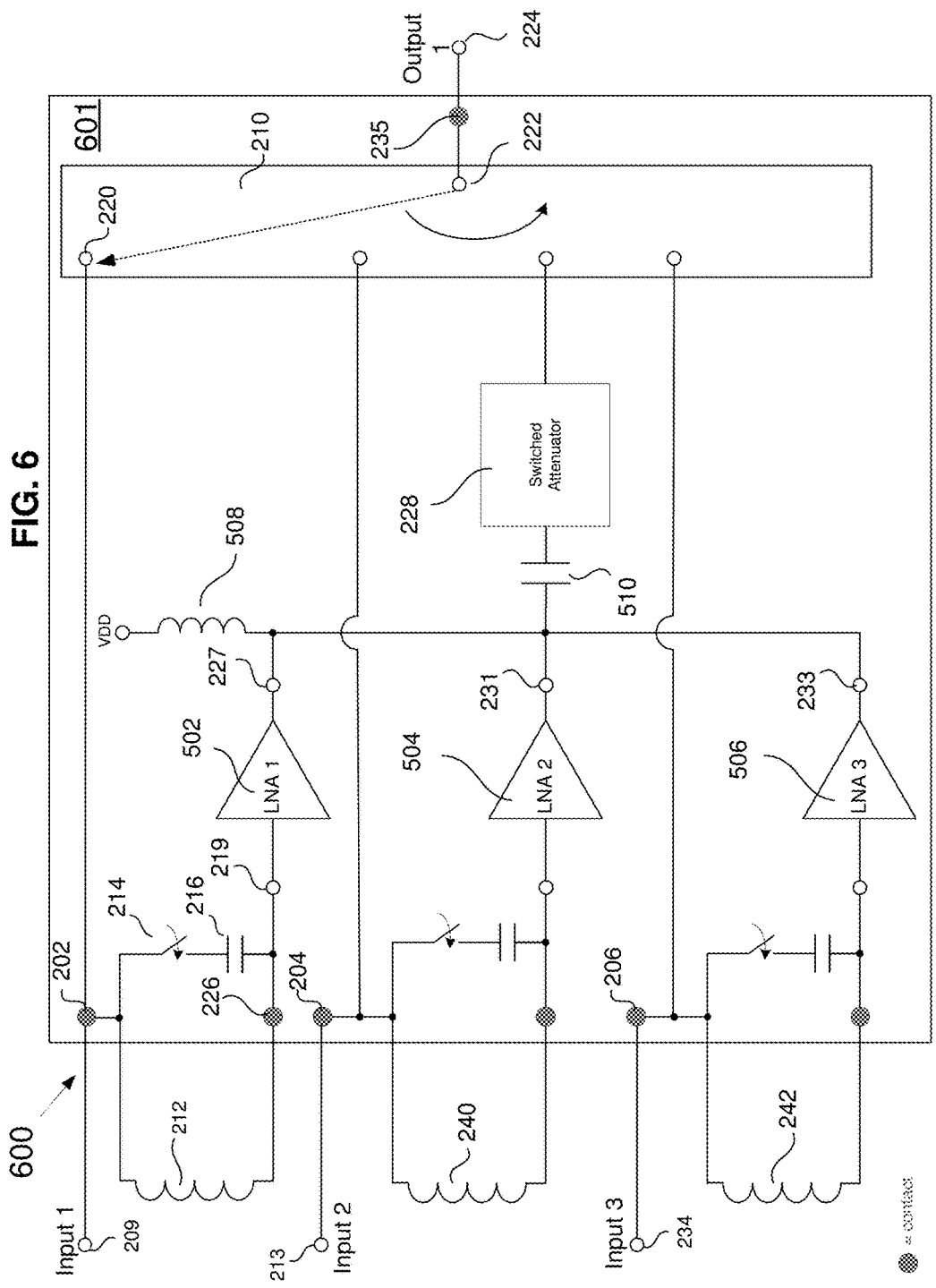
FIG. 6 shows the three LNAs of FIG. 5 integrated into an FEM.

FIG. 5 is an illustration of three LNAs 502, 504, 506, coupled together at their outputs 227, 231, 233. FIG. 6 shows the three LNAs 502, 504, 506 integrated into an LNAIC 601 of an FEM 600. FIG. 5 shows one of the LNAs 502 in greater detail. In some embodiments, the other two LNAs 231, 233 are similar. Therefore, for the sake of simplicity, only LNA 502 is discussed in detail. In some embodiments in which several LNAs 502, 504, 506 are directly coupled at their outputs 227, 231, 233 the parasitic capacitance of the output FETs 404 in the LNAs 502, 504, 506 can shift the output impedance of the FEM 200, creating an output impedance mismatch. In some such cases, an inductance 507 coupled to the drain of the output FET 404 can offset the parasitic capacitance of the output FET 404.

Accordingly, coupling the outputs 227, 231, 233 of several such LNAs 502, 504, 506 together has a minimal adverse effect on the output impedance match of the FEM 600. In the embodiment shown in FIG. 6, the inductance 508 is within the LNAIC 601. In some embodiments, the inductance 508 can be provided by the routing inductance of the conductive path between the drain of the FET 404 and the point at which the outputs from each LNA 502, 504, 506 are combined. In other embodiments an inductor 508 is placed outside the LNAIC 601. Likewise, the output capacitor 510 can be either within the LNAIC 601 or outside the LNAIC 601.

In some embodiments, one or more of the LNAs 502, 504, 506 are implemented using multiple amplifier legs, as is disclosed in copending U.S. patent application Ser. No. 15/272,103, entitled "LNA with Programmable Linearity", U.S. patent application Ser. No. 15/479,173, entitled "Optimized Multi Gain LNA Enabling Low Current and High Linearity Including Highly Linear Active Bypass" and U.S. patent application Ser. No. 15/430,332, entitled "Programmable Optimized Band Switching LNA for Operation in Multiple Narrow-Band Frequency Ranges", each of which is incorporated by reference. In addition, other LNA configurations and embodiments can be used in accordance with the present method and apparatus. Furthermore, the capacitors 216, 260 can be implemented at digitally tunable capacitors, such as for example, disclosed in U.S. Pat. No. 9,024,700 entitled "Method and apparatus for use in digitally tuning a capacitor in an integrated circuit device".

Figure 7:
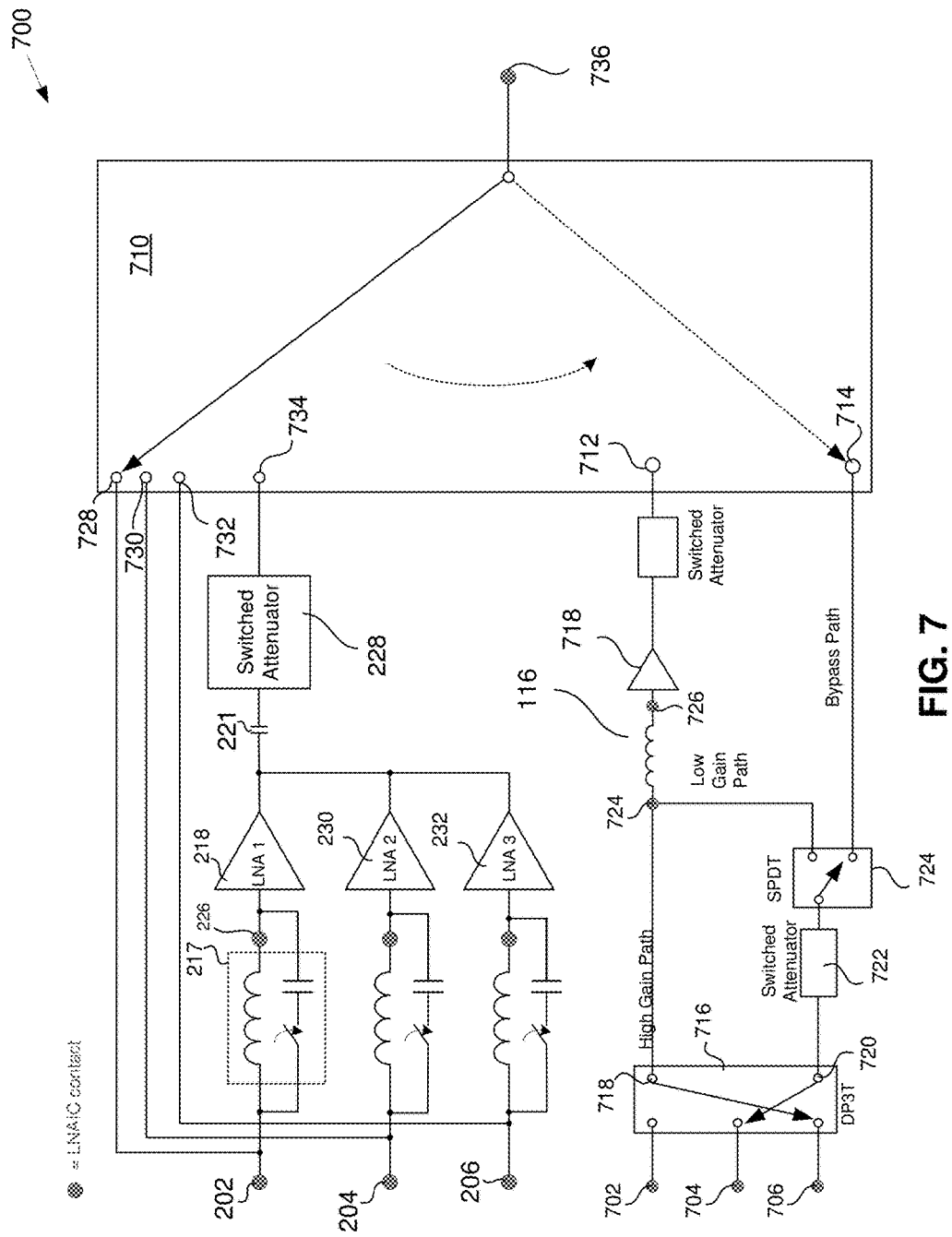
FIG. 7 is a simplified schematic of an FEM and associated external tank circuits and input inductor.

FIG. 7 is a simplified schematic of an FEM 700 having an LNAIC and associated external input inductor 116. The LNAIC has input connection points 202, 204, 206, 702, 704, 706 for receiving six input signals. Three of the input signals are coupled to the input connection points 202, 204, 206 that are in turn coupled to one of three respective tank circuits 217. These three input connection points 202, 204, 206 are also coupled to inputs to an output selector switch 710. The tank circuits 217 are each coupled between a respective one of the three input connection points 202, 204, 206 and a respective one of three LNAs 218, 230, 232. The outputs of the three LNAs 218, 230, 232 are coupled together. The combined output of the LNAs 218, 230, 232 is coupled through an output capacitor 221 to a switched attenuator 228. The output of the switched attenuator 228 is coupled to an input to the output selector switch 710. Accordingly, in similar fashion to that of the FEM 200 discussed above with respect to FIG. 2 and FIG. 3, the FEM 700 can select between three bypass modes and an active gain mode in which the outputs of one of the three LNAs 218, 230, 232 is output through the output select switch 710.

In addition, the output selector switch 710 has a fifth and sixth input 712, 714. The fifth input 712 is a high/low gain input. The high/low gain input provides either a high gain or low gain path to the output of the FEM 700 for one of the inputs applied to the input contacts 702, 704, 706. A high/low gain switch 716 is implemented in one embodiment as a double-pole, three-throw switch 716. The high/low gain switch 716 has three inputs that can each be switchably connected to a first output or a second output of the switch 716. In some embodiments, only one of the two outputs is active at any one time. If one of the input contacts 702, 704, 706 is coupled through the switch 716 to the first output 718, the signals applied to that input will be coupled to an LNA 718 through an input inductor 116. Accordingly, if the output selector switch 710 is set to select the input 712, then a high gain path will be established through the FEM 700 for signals applied to the input contact 702, 704, 706 selected by the input switch 716.

Alternatively, if one of the contacts 702, 704, 706 is selected by the input switch 716 to be output on the second output 720, then the signal applied to that contact 702, 704, 706 is coupled to a switched attenuator 722. The output of the attenuator 722 is coupled to a single-pole, double-throw (SPDT) switch 724. The first output of the SPDT switch 724 is coupled to the input inductor 116 that feeds the input of the LNA 718. Accordingly, if the output selector switch is set to select the fifth input 712, a low gain path is established between the input contact 702, 704, 706 selected by the switch 716 and the output of the FEM 700.

In yet another mode, if the output selector switch 710 selects the sixth input 714, then the input switch 716 couples signals applied to one of the input contacts 702, 704, 706 to the second output 720 of the switch 716 and the SPDT switch 724 couples the signal to sixth input of the output selector switch 710. This establishes a fourth bypass mode in which signals applied to one of the input contacts 702, 704, 706 can be routed to the output of the FEM 700 over a bypass path (i.e., without amplification by the FEM 700).

By providing the output selector switch 710 that can select from signals applied to the first three input connection points 202, 204, 206 or the second three contacts 702, 704, 706, the FEM 700 can provide the benefits of having a low noise figure, high gain path for critical signals applied to the first three inputs of the FEM 700. In addition, signals applied to these three inputs contacts 202, 204, 206 can be combined with each being amplified by a selected amount of gain. Since there is no input selector switch in the path prior to amplification of the signals, the noise figure is relatively low for signals that are routed through this path of the FEM 700. In addition, such critical signals can also follow a bypass path through the FEM 700 in which no amplification is applied.

However, providing the benefit of having a low noise figure on the high gain path requires one tank circuit 217 and one LNA 218, 230, 232 for each input. The inductors are typically relatively large. In contrast, providing three contacts 702, 704, 706 that use the same input inductor 116 and LNA 718 requires only one inductor (as opposed to 3 inductors for the three inputs) and one LNA 718 (as opposed to three LNAs for the three inputs). Such inputs can be used for signals for which it is not as important to have a low noise figure and the ability to combine signals. Therefore, the FEM 700 has the advantages of both a low noise figure FEM with the ability to combine some of the input signals, while still maintaining a relatively small size by having other inputs that share the same input inductor and LNA.

It should be noted that an FEM in accordance with the present disclosure can use any combination of inputs coupled to an input selector switch (such as the switch 716 of the FEM 700) and inputs coupled to tank circuits 217. The FEM 700 is one example in which the FEM 700 has 3 inputs coupled to an input selector switch 716 and three inputs coupled to tank circuits 217. Furthermore, all of the LNAs in an FEM in accordance with the disclosed method and apparatus can be implemented using any of the techniques noted above. That is, the claimed FEM is not limited by a particular LNA configuration, other than as expressly recited in the appended claims.

Figure 8:
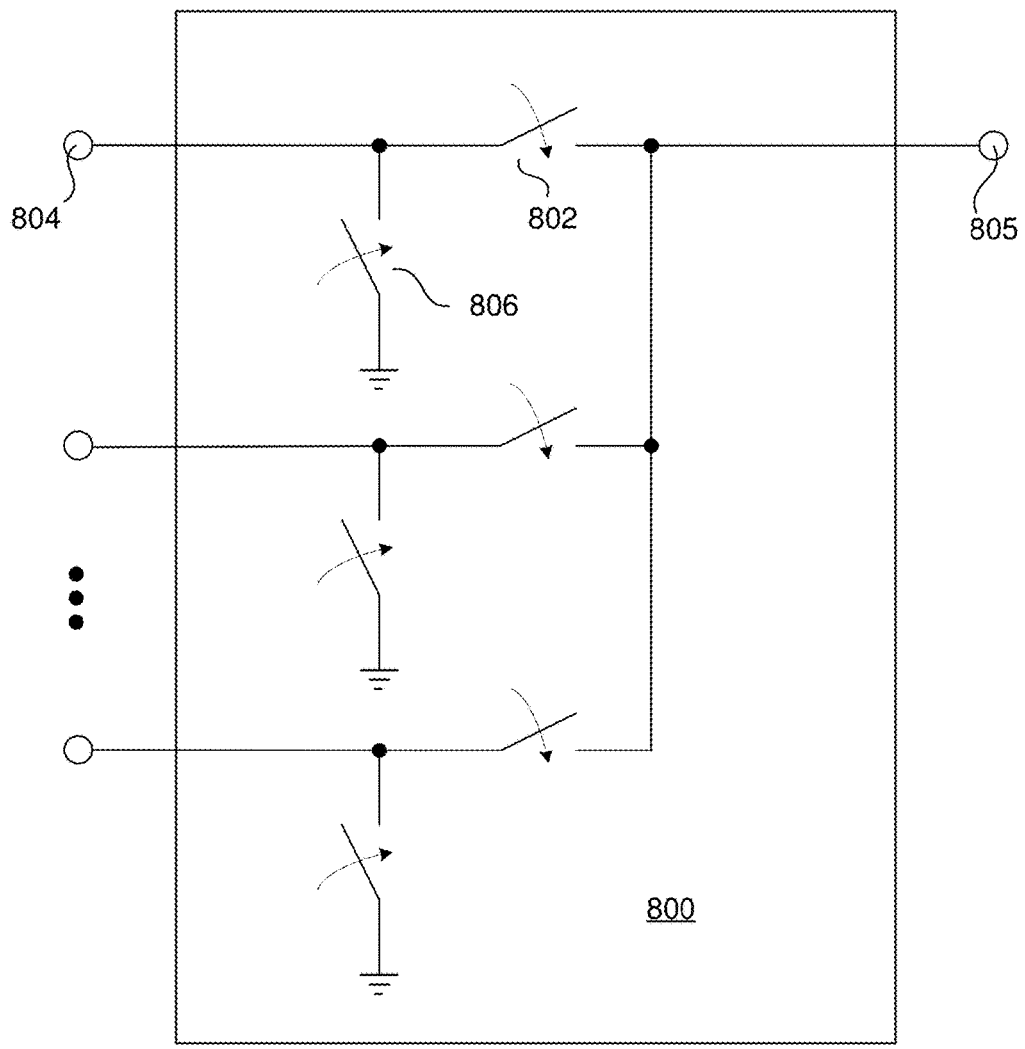
FIG. 8 is a simplified schematic of a selector switch.

FIG. 8 is a simplified schematic of a selector switch 800. The selector switch 800 may be used as the output selector switch 210, 710 shown in the previous figures. In some embodiments, the switch 800 has a plurality of output switches 802, each corresponding to an associated input 804 and coupled between the associated input 804 and the switch output 805. The switch 800 also has a plurality of ground switches 806, each corresponding to an associated output switch 802 and input 804. Each ground switch 806 is coupled between the associated input 804 and ground. In some embodiments, only one output switch 802 is closed at any one time. In addition, only the ground switch 806 associated with the closed output switch 802 is open. All other ground switches 806 are closed. Therefore, any one (and only one) of the inputs 804 can be coupled to the output 805 at a time. All other inputs 804 are shunted to ground. In some embodiments, each of the switches 802, 806 are implemented using FETs.

Figure 9:
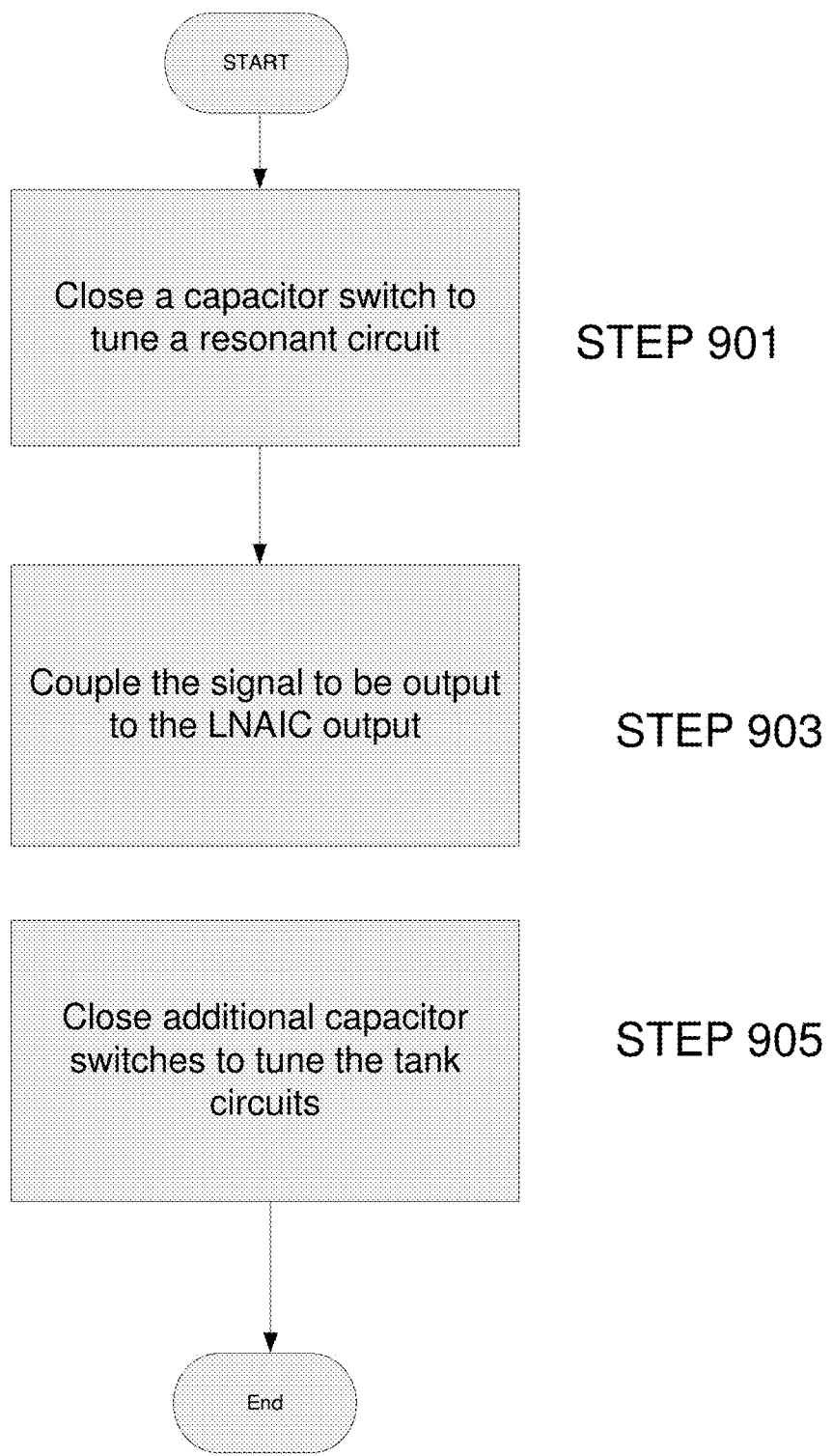
FIG. 9 is a flow diagram of a method in accordance with one disclosed embodiment.

FIG. 9 is a flow diagram of a method in accordance with one disclosed embodiment. Referring to the FEM 200 shown in FIG. 2, one or more of the capacitor switches 214, 236, 238 are closed to tune the corresponding resonant circuit 217 to present a relatively high impedance between the FEM inputs 209, 213, 234 and the inputs of the corresponding amplifiers that are inactive (STEP 901). That is, if a signal presented to one of the inputs is to be coupled to the FEM output in bypass mode, then at least the tank circuit 217 associated with that input 209, 213, 234 is tuned to have a high impedance at the operational frequency. In addition, the input 220, 211, 225 of the output selector switch 210 corresponding with the FEM input 209, 213, 234 on which the signal is presented is selected to be coupled to the output 222 of the output selector switch 210, which in turn is coupled to the output connection point 235 of the LNAIC 201 and ultimately to the output 224 of the FEM 200 (STEP 903). In the case of an LNAIC 201 such as is shown in FIG. 2, having several LNAs 218, 230, 232, several tank circuits 217 may be tuned to have a relatively high impedance (i.e., capacitor switches 214, 236, 238 are closed) (STEP 905). Furthermore, in embodiments such as the LNAIC 301 shown in FIG. 3, there may be more than one capacitance switch 214, 258 that can be closed to tune the corresponding tank circuit 217 to have the optimal impedance at the operational frequency of the signal presented to the FEM inputs 209, 213, 234.

Figure 10:
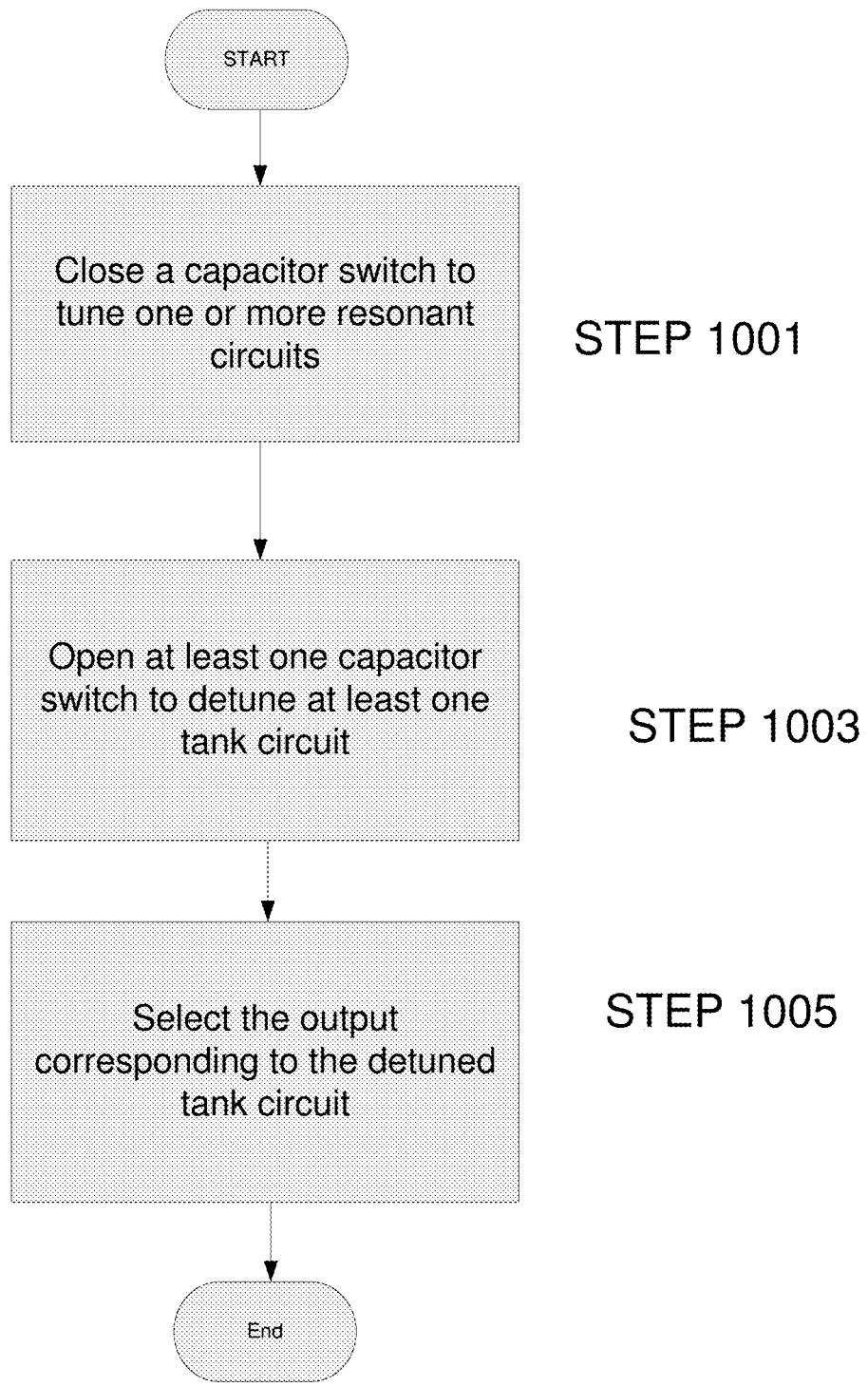
FIG. 10 is a flow diagram of a method in accordance with the disclosed embodiment in which at least one of the LNAs is active.

FIG. 10 is a flow diagram of a method in accordance with the disclosed embodiment in which at least one of the LNAs 218, 230, 232 is active. Those capacitor switches 214, 236, 238 corresponding to inactive LNAs 218, 230, 232 are closed (STEP 1001). However, any tank circuit 217 associated with an active LNA 218, 230, 232 is detuned by opening the corresponding capacitor switch 214, 236, 238

(STEP 1003). The output selector switch 210 selects the input 215 that is coupled to the outputs of the LNAs 218, 230, 232 (STEP 1005).

Figure 11:
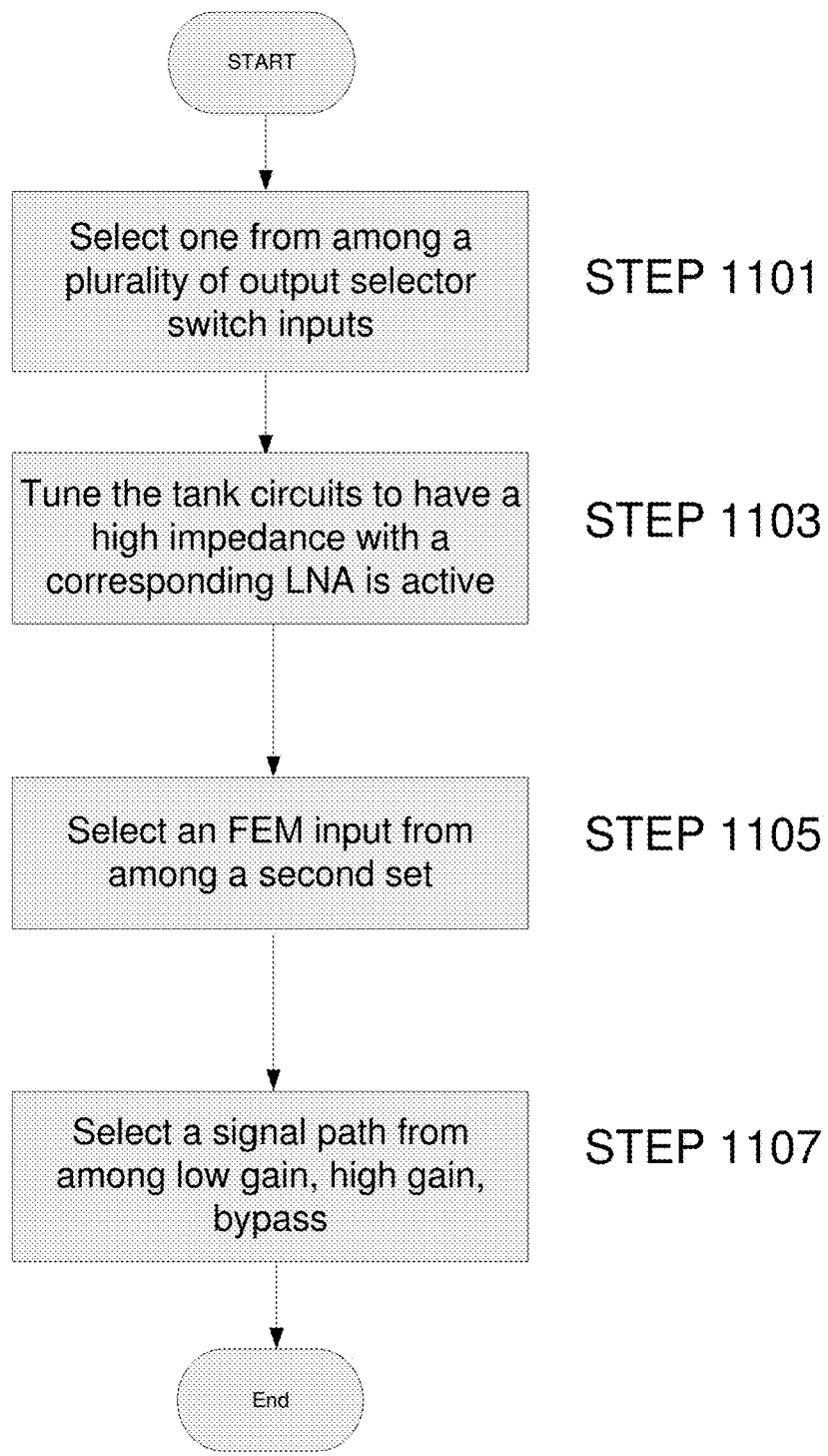
FIG. 11 is a flow diagram of a method in accordance with the disclosed embodiment in which the FEM shown in FIG. 7 is used.

FIG. 11 is a flow diagram of a method in accordance with the disclosed embodiment in which the FEM 700 shown in FIG. 7 is used. The output selector switch 710 selects one from among several output selector switch inputs 712, 714, 728, 730, 732, 734 to be coupled to the FEM output 736 (STEP 1101). In the example shown in FIG. 7, four of the inputs 728, 730, 732, 734 to the output selector switch 710 are associated with FEM inputs 202, 204, 206 from a first set. Depending upon which input 728, 730, 732, 734 is selected, the tank circuits 217 are either tuned or detuned (STEP 1103). If either the input 712 or the input 714 are selected, then an FEM input is selected from a second set 702, 704, 706 (STEP 1105). In that case, a high/low gain switch 716 and an SPDT switch 724 determine which of the FEM inputs 702, 704, 706 are selected and whether the signals applied to those inputs traverse a high gain path, low gain path or bypass path (STEP 1107).

As should be readily apparent to one of ordinary skill in the art, various embodiments of the invention can be implemented to meet a wide variety of specifications. Thus, selection of suitable component values is a matter of design choice (so long as the frequencies of interest mentioned above can be handled). The switching and passive elements may be implemented in any suitable integrated circuit (IC) technology, including but not limited to MOSFET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents. In addition, components, such as capacitors and inductors, etc., while shown as one component, may be implemented as several components that are grouped and switchable to provide digitally selectable component values. For example, capacitors 216, 223, 229 shown in FIG. 3A may each be implemented as pairs of switches 214, 258 and capacitors 216, 260, as shown in FIG. 3B.

A number of embodiments have been described. It is to be understood that various modifications may be made without departing from the spirit and scope of the claimed invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A front end module (FEM), including:
    (a) a first FEM input;
    (b) an output selector switch having a plurality of switch inputs, the first of the plurality of switch inputs coupled to the first FEM input, the output selector switch further having a switch output, the switch output being selectively coupled to one of the plurality of switch inputs;
    (c) a switchable tank circuit having a first and second terminal, the first terminal coupled to the first FEM input; and
    (d) an amplifier having an amplifier input and an amplifier output, the amplifier input coupled to the second terminal of the tank circuit and the amplifier output coupled to a second of the plurality of switch inputs.

2. The FEM of claim 1, wherein the switchable tank circuit comprises at least a first series combination comprising a first capacitance in series with a first capacitor switch, the switchable tank circuit further comprising an inductor coupled in parallel with the first series combination.

3. The FEM of claim 2, wherein the switchable tank circuit comprises at least a second series combination in parallel with the first series combination.

4. The FEM of claim 1, further including:
    (a) at least one additional switchable tank circuit, each having a first and second terminal;
    (b) at least one additional FEM input associated with and coupled to a corresponding one of the additional switchable tank circuits and further coupled to an associated switch input; and
    (c) at least one additional amplifier associated with a corresponding one of the at least one additional FEM inputs and coupled between the second terminal of the switchable tank circuit and a corresponding one of the plurality of output selector switch inputs.

5. The FEM of claim 4, wherein the corresponding one of the plurality of switch inputs to which the at least one additional amplifier is coupled is the second of the plurality of switch inputs.

6. The FEM of claim 4, further comprising a switched attenuator coupled to the output of the amplifier.

7. A low noise amplifier integrated circuit (LNAIC) comprising:
    (a) a first input connection point;
    (b) an inductance connection point;
    (c) an output selector switch having a plurality of switch inputs, the first of the plurality of switch inputs coupled to the first input connection point, the output selector switch further having a switch output, the switch output being selectively coupled to one of the plurality of switch inputs;
    (d) a series combination comprising a capacitance and a capacitance switch, the series combination coupled in series between the first input connection point and the inductance connection point; and
    (e) an amplifier having an amplifier input and an amplifier output, the amplifier input coupled to the inductance connection point and the amplifier output coupled to a second of the plurality of switch inputs.

8. The LNAIC of claim 7, further comprising at least a second series combination in parallel with the first series combination.

9. The LNAIC of claim 7, further comprising:
    (a) at least one additional input connection point, each additional input connection point associated with a corresponding one of the switch inputs and coupled to the corresponding switch input;
    (b) additional inductance connection points, each additional inductance connection point associated with a corresponding one of the additional input connection points; and
    (c) at least one additional amplifier associated with a corresponding one of the additional input connections and one of the additional inductance connection points and coupled between the first tank circuit connection point of the corresponding pair and the corresponding switch input.

10. The LNAIC of claim 9, wherein the output selector switch further comprises a high/low gain input and a bypass input, the LNAIC further comprising:
   (a) a high/low gain switch having three inputs and two outputs, each output being switchably connected to each input;
   (b) a first switched attenuator having an attenuator input and an attenuator output, the attenuator input coupled to the first of the two gain switch outputs;
   (c) a bypass/low gain selector switch having an input and two outputs, the input being switchably connected to one of the outputs, the input coupled to the attenuator output, the first output coupled to the bypass input of the output selector switch and the second output coupled to the second of the two outputs of the high/low gain selector switch;
   (d) an high/low gain path amplifier having an input and an output, the input coupled to the second output of the high/low gain selector switch; and
   (e) a second switched attenuator having a second attenuator input and a second attenuator output, the second attenuator input coupled to the high/low gain path amplifier output and the second attenuator output coupled to the high/low gain input of the output selector switch.

11. The LNAIC of claim 7, further comprising a switched attenuator coupled to the amplifier output.

12. A method for coupling a signal from a front end module (FEM) to an FEM output, the method comprising:
   (a) selecting one from among a plurality of output selector switch inputs to couple to the FEM output, wherein at least one FEM input from among a first set of FEM inputs is coupled to a corresponding one of the selector switch inputs; at least one FEM input of the first set is coupled to a corresponding switchable tank circuit, the switchable tank circuit being coupled to an input of a corresponding amplifier and an output of the corresponding amplifier being coupled to a corresponding one of the inputs of the output selector switch, at least one of the output selector switch inputs is coupled to a high/low gain signal path and at least one of the output selector switch inputs is coupled to a bypass path;
   (b) selectively tune the switchable tank circuits to have a relatively high impedance when the corresponding amplifier is not active;
   (c) selecting an FEM input from among a second set of FEM inputs, the selected FEM input being coupled to one of two output selector switch inputs; and
   (d) selecting a signal path for the FEM input selected in (c), the path selected from among a low gain path, a high gain path and a bypass path.

* * * * *